(12) United States Patent
Manna et al.

(10) Patent No.: US 9,624,577 B2
(45) Date of Patent: Apr. 18, 2017

(54) DEPOSITION OF METAL DOPED AMORPHOUS CARBON FILM

(71) Applicant: Applied Materials, Inc., Santa Clara, CA (US)

(72) Inventors: Pramit Manna, Sunnyvale, CA (US); Abhijit Basu Mallick, Fremont, CA (US); Mukund Srinivasan, Fremont, CA (US); Rui Cheng, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/697,385

(22) Filed: Apr. 27, 2015

(65) Prior Publication Data

US 2016/0027614 A1  Jan. 28, 2016

Related U.S. Application Data

(60) Provisional application No. 62/027,460, filed on Jul. 22, 2014.

(51) Int. Cl.

| | | |
|---|---|---|
| C23F 1/02 | (2006.01) |
| C23C 16/26 | (2006.01) |
| C23C 16/04 | (2006.01) |
| C23C 16/06 | (2006.01) |
| H01J 37/32 | (2006.01) |
| C23C 16/30 | (2006.01) |

(52) U.S. Cl.
CPC ............ *C23C 16/26* (2013.01); *C23C 16/042* (2013.01); *C23C 16/06* (2013.01); *C23C 16/30* (2013.01); *H01J 37/32091* (2013.01)

(58) Field of Classification Search
CPC .................. C23C 16/32; C23C 16/4554
USPC .............. 216/37, 49, 67; 438/694, 710; 427/249.1, 535, 569
See application file for complete search history.

(56) References Cited

U.S. PATENT DOCUMENTS

| | | |
|---|---|---|
| 5,942,204 A | 8/1999 | Dunmead et al. |
| 6,440,640 B1 | 8/2002 | Yang et al. |
| 6,482,262 B1 | 11/2002 | Elers et al. |
| 6,576,404 B2 * | 6/2003 | Hu .......................... C23F 4/00 257/E21.314 |
| 7,611,751 B2 | 11/2009 | Elers |

(Continued)

*Primary Examiner* — Duy Deo
*Assistant Examiner* — Maki Angadi
(74) *Attorney, Agent, or Firm* — Patterson + Sheridan, LLP

(57) ABSTRACT

Embodiments of the present disclosure relate to a metal-doped amorphous carbon hardmask for etching the underlying layer, layer stack, or structure. In one embodiment, a method of processing a substrate in a processing chamber includes exposing a substrate to a gas mixture comprising a carbon-containing precursor and a metal-containing precursor, reacting the carbon-containing precursor and the metal-containing precursor in the processing chamber to form a metal-doped carbon layer over a surface of the substrate, forming in the metal-doped carbon layer a defined pattern of through openings, and transferring the defined pattern to an underlying layer beneath the metal-doped carbon layer using the metal-doped carbon layer as a mask. An etch hardmask using the inventive metal-doped amorphous carbon film provides reduced compressive stress, high hardness, and therefore higher etch selectivity.

8 Claims, 3 Drawing Sheets

(56) References Cited

U.S. PATENT DOCUMENTS

| | | | |
|---|---|---|---|
| 7,666,474 B2* | 2/2010 | Li | C23C 16/32 |
| | | | 427/249.1 |
| 7,947,372 B2 | 5/2011 | Dekempeneer | |
| 2001/0009695 A1 | 7/2001 | Saanila et al. | |
| 2002/0159944 A1 | 10/2002 | Smalley et al. | |
| 2008/0020248 A1 | 1/2008 | Sridhar et al. | |
| 2014/0213059 A1* | 7/2014 | Doan | H01L 21/31138 |
| | | | 438/694 |

* cited by examiner

DEPOSITION OF METAL DOPED AMORPHOUS CARBON FILM

CROSS-REFERENCE TO RELATED APPLICATIONS

This application claims priority to U.S. provisional patent application Ser. No. 62/027,460, filed Jul. 22, 2014, which is herein incorporated by reference.

BACKGROUND

Field

Embodiments of the present disclosure generally relate to the fabrication of integrated circuits and particularly to the deposition of an amorphous carbon layer with high film density and high etch selectivity.

Description of the Related Art

Development of hardmask materials having high etch selectivity is a critical task for patterning new generation NAND and DRAM devices. Carbon-based materials, such as amorphous carbon (denoted as a-C), has been proved to be an effective material serving as etch hardmask for oxide, nitride, poly-Si, or metal (e.g., Al) materials due to its chemical inertness, optical transparency, and good mechanical properties.

To ensure that the desired amorphous carbon film adequately protects underlying dielectric stacks during the subsequent etching process, it is important that amorphous carbon film possesses a relatively high etch selectivity, or removal rate ratio, with respect to an underlying material layer. Higher etch selectivity is advantageous to transfer the patterns to underlayers accurately. One way to increase the etch selectivity is to densify the amorphous carbon film by increasing C:H ratio, which, however, results in high compressive film stress that may significantly impact the feature transfer during the lithographic process. High compressive film stress induces line bending of high aspect ratio structure or line breakage during the subsequent etching process, especially when the feature size shrinks to 20 nm and beyond.

Therefore, there is a need in the art for a hardmask with reduced compressive film stress, excellent etch selectivity, and line bending control.

SUMMARY

Embodiments of the present disclosure generally relate to the fabrication of integrated circuits and particularly to the deposition of a metal-doped amorphous carbon layer on a semiconductor substrate. In one embodiment, a method of processing a substrate in a processing chamber is provided. The method includes exposing a substrate to a gas mixture comprising a carbon-containing precursor and a metal-containing precursor, reacting the carbon-containing precursor and the metal-containing precursor in the processing chamber to form a metal-doped carbon layer over a surface of the substrate, forming in the metal-doped carbon layer a defined pattern of through openings, and transferring the defined pattern to an underlying layer beneath the metal-doped carbon layer using the metal-doped carbon layer as a mask.

In another embodiment, the method includes exposing a substrate to a gas mixture comprising a hydrocarbon-containing precursor and a metal-containing precursor, reacting the hydrocarbon-containing precursor and the metal-containing precursor in the processing chamber to form a metal-doped amorphous carbon layer over a surface of the substrate, forming in the metal-doped amorphous carbon layer a defined pattern of through openings, and transferring the defined pattern to an underlying layer beneath the metal-doped carbon layer using the metal-doped carbon layer as a mask.

In yet another embodiment, the method includes exposing a substrate to a gas mixture comprising a metal-containing precursor, decomposing the gas mixture in the processing chamber to form a metal-doped carbon layer over a surface of the substrate, forming a defined pattern of through openings in the metal-doped carbon layer, and transferring the defined pattern to an underlying layer beneath the metal-doped carbon layer using the metal-doped carbon layer as a mask.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to the fabrication of integrated circuits and particularly to the deposition of an amorphous carbon layer on a semiconductor substrate, more particularly, to the deposition of a metal-doped amorphous carbon layer for use as an etch hardmask for etching the underlying layer, layer stack, or structure. In various embodiments, a synthesis of amorphous carbon films doped with transition metals is provided. The inventive metal-doped amorphous carbon films may be prepared by using metal halides as metal source and hydrocarbons as carbon source. An etch hardmask using the inventive metal-doped amorphous carbon film provides reduced compressive stress, high hardness, and therefore higher etch selectivity. High etch selectivity enables an even thinner hardmask which improves etch margin and allows for controllable etch of smaller features, thereby obtaining a superior line integrity for devices under sub 45 nm without having conventional issues associated with line wiggling and line bending. Details of the disclosure and various implementations are discussed below.

Exemplary Chamber Hardware for Deposition Process

Figure 1:
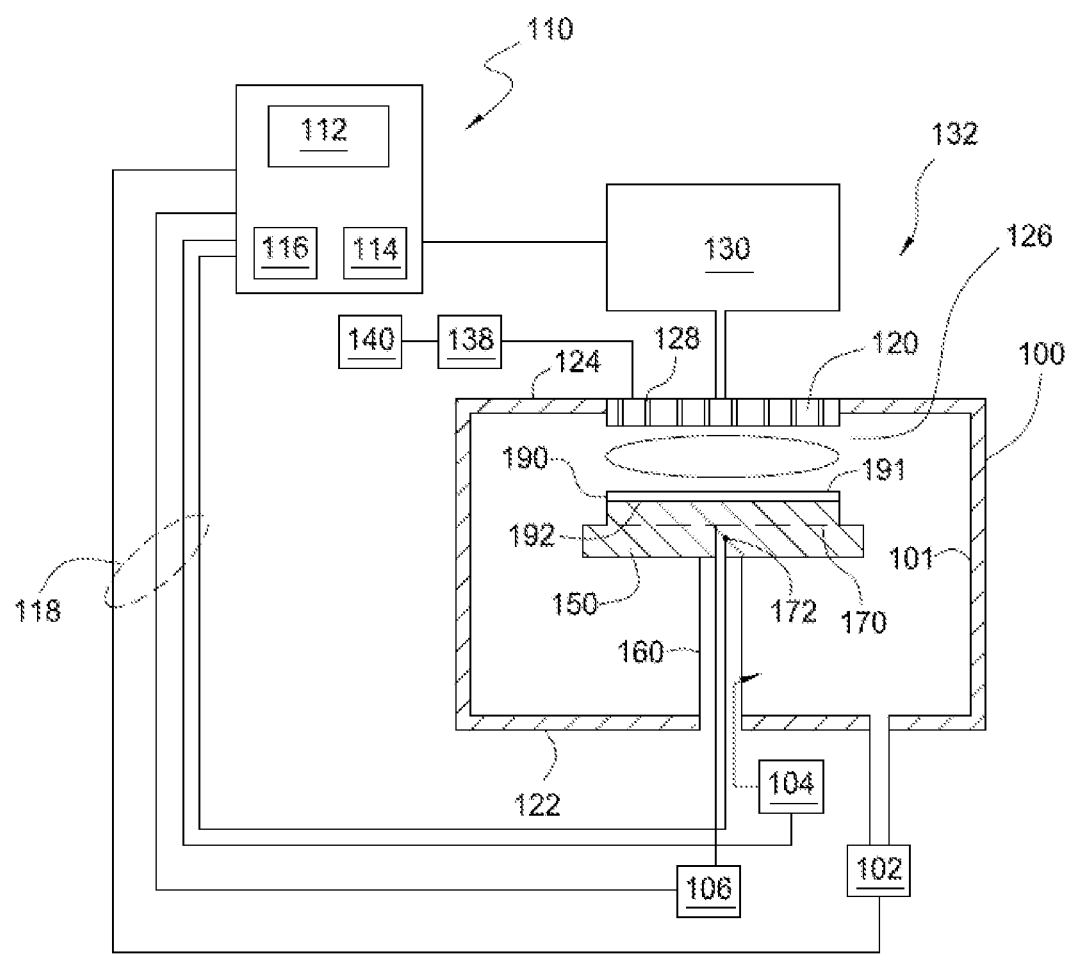
FIG. 1 depicts a schematic illustration of an apparatus that can be used for the practice of embodiments described herein.

FIG. 1 is a schematic representation of a substrate processing system 132, which can be used for amorphous carbon layer deposition according to embodiments described herein. Examples of suitable chamber include the CENTURA® systems which may use a DxZ™ process chamber, PRECISION 5000® systems, PRODUCER™ systems, such as the PRODUCER SE™ process chamber and the PRODUCER GT™ process chamber, all of which are commercially available from Applied Materials, Inc., of Santa Clara, Calif. It is contemplated that the processes described herein may be performed on other substrate processing systems, including those from other manufacturers.

The substrate processing system 132 includes a process chamber 100 coupled to a gas panel 130 and a controller 110. The process chamber 100 generally includes a top 124, a side 101 and a bottom wall 122 that define an interior processing volume 126. A support pedestal 150 is provided in the interior processing volume 126 of the chamber 100. The pedestal 150 is supported by a stem 160 and may be typically fabricated from aluminum, ceramic, and other suitable materials. The pedestal 150 may be moved in a vertical direction inside the chamber 100 using a displacement mechanism (not shown).

The pedestal 150 may include an embedded heater element 170 suitable for controlling the temperature of a substrate 190 supported on a surface 192 of the pedestal 150. The pedestal 150 may be resistively heated by applying an electric current from a power supply 106 to the heater element 170. The heater element 170 may be made of a nickel-chromium wire encapsulated in a nickel-iron-chromium alloy (e.g., INCOLOY®) sheath tube. The electric current supplied from the power supply 106 is regulated by the controller 110 to control the heat generated by the heater element 170, thereby maintaining the substrate 190 and the pedestal 150 at a substantially constant temperature during film deposition. The supplied electric current may be adjusted to selectively control the temperature of the pedestal 150 between about 100 degrees Celsius to about 700 degrees Celsius.

A temperature sensor 172, such as a thermocouple, may be embedded in the support pedestal 150 to monitor the temperature of the pedestal 150 in a conventional manner. The measured temperature is used by the controller 110 to control the power supplied to the heating element 170 to maintain the substrate at a desired temperature.

A vacuum pump 102 is coupled to a port formed in the bottom of the chamber 100. The vacuum pump 102 is used to maintain a desired gas pressure in the process chamber 100. The vacuum pump 102 also evacuates post-processing gases and by-products of the process from the chamber 100.

The processing system 132 may further include additional equipment for controlling the chamber pressure, for example, valves (e.g. throttle valves and isolation valves) positioned between the process chamber 100 and the vacuum pump 102 to control the chamber pressure.

A showerhead 120 having a plurality of apertures 128 is disposed on the top of the process chamber 100 above the substrate support pedestal 150. The apertures 128 of the showerhead 120 are utilized to introduce process gases into the chamber 100. The apertures 128 may have different sizes, number, distributions, shape, design, and diameters to facilitate the flow of the various process gases for different process requirements. The showerhead 120 is connected to the gas panel 130 that allows various gases to supply to the interior processing volume 126 during process. A plasma is formed from the process gas mixture exiting the showerhead 120 to enhance thermal decomposition of the process gases resulting in the deposition of material on a surface 191 of the substrate 190.

The gas panel 130 may also be used to control and supply various vaporized liquid precursors. While not shown, liquid precursors from a liquid precursor supply may be vaporized, for example, by a liquid injection vaporizer, and delivered to the process chamber 100 in the presence of a carrier gas. The carrier gas is typically an inert gas, such as nitrogen, or a noble gas, such as argon or helium. Alternatively, the liquid precursor may be vaporized from an ampoule by a thermal and/or vacuum enhanced vaporization process.

The showerhead 120 and substrate support pedestal 150 may form a pair of spaced apart electrodes in the interior processing volume 126. One or more RF power sources 140 provide a bias potential through a matching network 138 to the showerhead 120 to facilitate generation of plasma between the showerhead 120 and the pedestal 150. Alternatively, the RF power sources 140 and matching network 138 may be coupled to the showerhead 120, substrate pedestal 150, or coupled to both the showerhead 120 and the substrate pedestal 150, or coupled to an antenna (not shown) disposed exterior to the chamber 100. In one embodiment, the RF power sources 140 may provide between about 100 Watts and about 3,000 Watts at a frequency of about 50 kHz to about 13.6 MHz. In another embodiment, the RF power sources 140 may provide between about 500 Watts and about 1,800 Watts at a frequency of about 50 kHz to about 13.6 MHz.

The controller 110 includes a central processing unit (CPU) 112, a memory 116, and a support circuit 114 utilized to control the process sequence and regulate the gas flows from the gas panel 130. The CPU 112 may be of any form of a general purpose computer processor that may be used in an industrial setting. The software routines can be stored in the memory 116, such as random access memory, read only memory, floppy, or hard disk drive, or other form of digital storage. The support circuit 114 is conventionally coupled to the CPU 112 and may include cache, clock circuits, input/output systems, power supplies, and the like. Bi-directional communications between the controller 110 and the various components of the processing system 132 are handled through numerous signal cables collectively referred to as signal buses 118, such as illustrated in FIG. 1.

Other deposition chambers may also benefit from the present disclosure and the parameters listed above may vary according to the particular deposition chamber used to form the amorphous carbon layer. For example, other deposition chambers may have a larger or smaller volume, requiring gas flow rates that are larger or smaller than those recited for deposition chambers available from Applied Materials, Inc.

Exemplary Fabrication Process for Hardmask

Figure 2A:
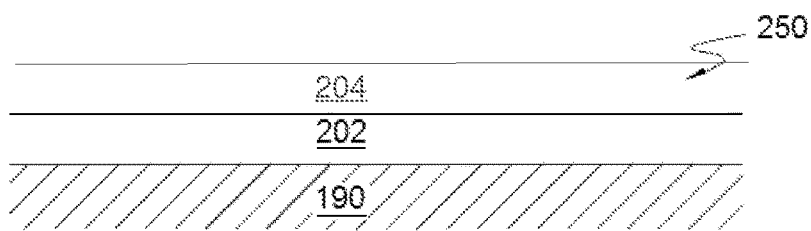
FIGS. 2A-2E illustrate schematic cross-sectional views of the substrate of FIG. 1 at different stages of an integrated circuit fabrication sequence for making a hardmask.

FIGS. 2A-2E illustrate schematic cross-sectional views of the substrate 190 of FIG. 1 at different stages of an integrated circuit fabrication sequence for making an etch hardmask. The substrate 190, as shown in FIGS. 1 and 2A, may have a substantially planar surface. Alternatively, the substrate may have patterned structures, a surface having trenches, holes, or vias formed therein. The substrate 190 may also have a substantially planar surface having a structure formed thereon or therein at a desired elevation. While the substrate 190 is illustrated in FIGS. 1 and 2 as a single body, it is understood that the substrate 190 may contain one or more material layers used in forming semiconductor devices such as metal contacts, trench isolations, gates, bit-lines, or any other interconnect features. A substrate structure 250 denotes the substrate 190 together with other material layers formed on the substrate 190.

The substrate 190 may comprise one or more metal layers, one or more dielectric materials, semiconductor material, and combinations thereof utilized to fabricate semiconductor devices. For example, the substrate 190 may include an oxide material, a nitride material, a polysilicon material, or the like, depending upon application. In one embodiment where a memory application is desired, the substrate 190 may include the silicon substrate material, an oxide material, and a nitride material, with or without polysilicon sandwiched in between.

In another embodiment, the substrate 190 may include a plurality of alternating oxide and nitride materials (i.e., oxide-nitride-oxide (ONO)) deposited on a surface of the substrate (not shown). In various embodiments, the substrate 190 may include a plurality of alternating oxide and nitride materials, one or more oxide or nitride materials, polysilicon or amorphous silicon materials, oxides alternating with amorphous silicon, oxides alternating with polysilicon, undoped silicon alternating with doped silicon, undoped polysilicon alternating with doped polysilicon, or undoped amorphous silicon alternating with doped amorphous silicon. The substrate 190 may be any substrate or material surface upon which film processing is performed. For example, the substrate 190 may be a material such as crystalline silicon, silicon oxide, silicon oxynitride, silicon nitride, strained silicon, silicon germanium, tungsten, titanium nitride, doped or undoped polysilicon, doped or undoped silicon wafers and patterned or non-patterned wafers, silicon on insulator (SOI), carbon doped silicon oxides, silicon nitrides, doped silicon, germanium, gallium arsenide, glass, sapphire, low k dielectrics, and combinations thereof.

FIG. 2A illustrates a cross-sectional view of a substrate structure 250 having a material layer 202 that has been previously formed thereon. The material layer 202 may be a dielectric material, for example an oxide layer, such as a low-k carbon containing dielectric layer, a porous silicon oxycarbide low-k or ultra low-k dielectric layer.

Figure 2B:
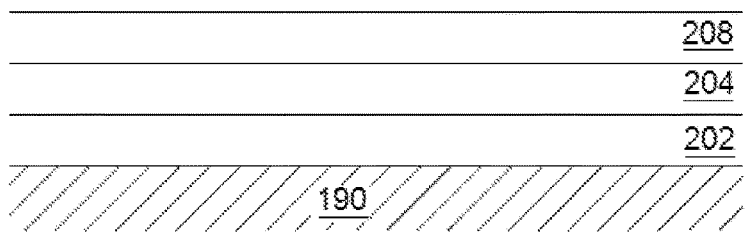

FIG. 2B depicts a metal-doped amorphous carbon layer 204 deposited on the substrate structure 250 of FIG. 2A. The metal-doped amorphous carbon layer 204 may be useful as a pattern transfer layer, or a hard mask, for subsequent etch processes. The metal-doped amorphous carbon layer 204 is formed on the substrate structure 250 by any suitable deposition process, such as via PECVD, as will be discussed in more detail below with respect to FIG. 3. Depending on the etch chemistry of the energy sensitive resist material 208 used in the fabrication sequence, an optional capping layer (not shown) may be formed on the metal-doped amorphous carbon layer 204 prior to the formation of energy sensitive resist material 208. The optional capping layer functions as a mask for the metal-doped amorphous carbon layer 204 when the pattern is transferred therein and protects amorphous carbon layer 204 from energy sensitive resist material 208.

As depicted in FIG. 2B, energy sensitive resist material 208 is formed on the metal-doped amorphous carbon layer 204. The layer of energy sensitive resist material 208 can be spin-coated on the substrate to a desired thickness. Most energy sensitive resist materials are sensitive to ultraviolet (UV) radiation having a wavelength less than about 450 nm, and for some applications having wavelengths of 245 nm or 193 nm. The energy sensitive resist material 208 may be a polymer material or a carbon-based polymer.

Figure 2C:
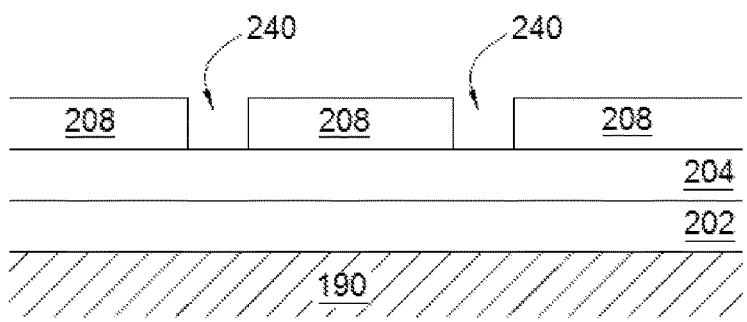

A pattern is introduced into the layer of energy sensitive resist material 208 by exposing energy sensitive resist material 208 to UV radiation 230 through a patterning device, such as a mask 210, and subsequently developing energy sensitive resist material 208 in an appropriate developer. After energy sensitive resist material 208 has been developed, a defined pattern of through openings 240 is present in energy sensitive resist material 208, as shown in FIG. 2C.

Figure 2D:
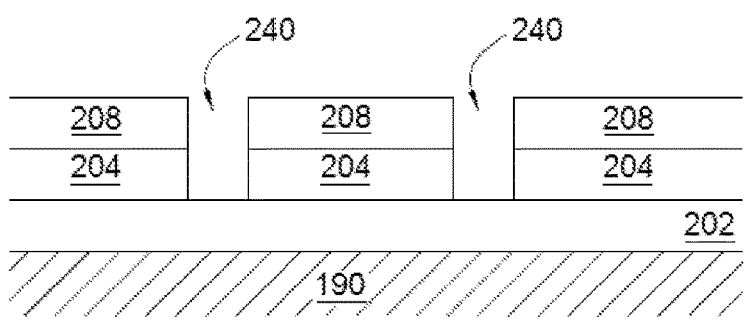

Thereafter, referring to FIG. 2D, the pattern defined in energy sensitive resist material 208 is transferred through the metal-doped amorphous carbon layer 204 using the energy sensitive resist material 208 as a mask. An appropriate chemical etchant is used that selectively etches the metal-doped amorphous carbon layer 204 over the energy sensitive resist material 208 and the material layer 202, extending openings 240 to the surface of material layer 202. Appropriate chemical etchants may include ozone, oxygen or ammonia plasmas.

Figure 2E:
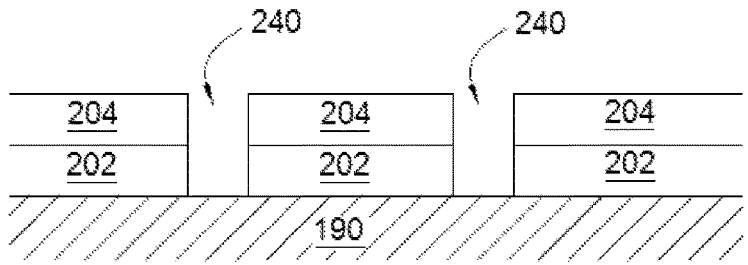

Referring to FIG. 2E, the pattern is then transferred through material layer 202 using the metal-doped amorphous carbon layer 204 as a hardmask. In this process step, an etchant is used that selectively removes material layer 202 over the metal-doped amorphous carbon layer 204, such as a dry etch, i.e. a non-reactive plasma etch. After the material layer 202 is patterned, the metal-doped amorphous carbon layer 204 can optionally be stripped from the substrate 190.

Exemplary Deposition Processes

Figure 3:
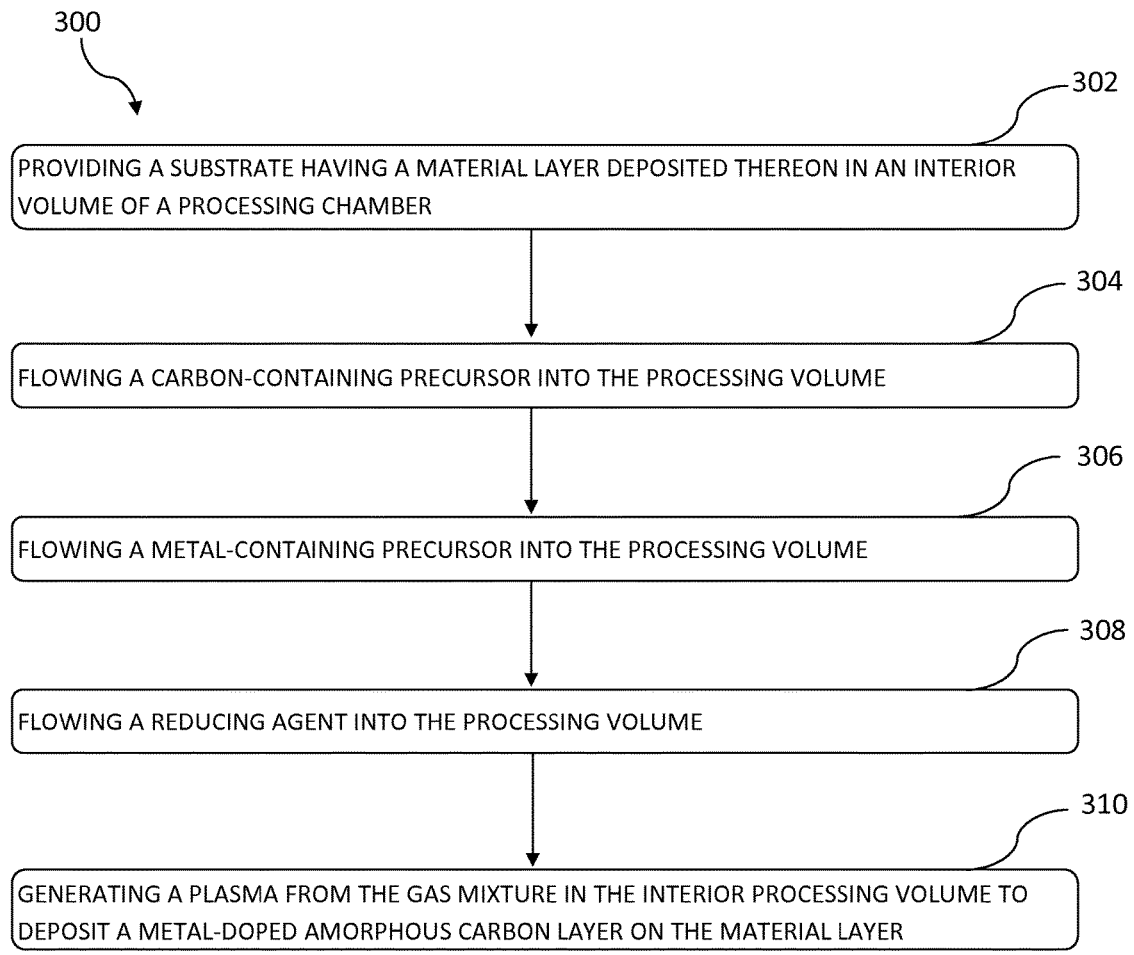
FIG. 3 is a process flow diagram depicting a method for depositing an etch hardmask according to embodiments of the present disclosure.

FIG. 3 is a process flow diagram depicting a method 300 for forming an etch hardmask, such as the metal-doped amorphous carbon layer 204 of FIGS. 2B-2E, according to embodiments of the present disclosure. It should be noted that the sequence of steps illustrated in FIG. 3 are not intended to be limiting as to the scope of the disclosure described herein, since one or more steps may be added, deleted and/or reordered without deviating from the basic scope of the disclosure.

The method 300 begins at block 302 by providing a substrate having a material layer deposited thereon in an interior volume of a processing chamber, such as the process chamber 100 of FIG. 1. The substrate and the material layer may be the substrate 190 and the material layer 202 as discussed above with respect to FIGS. 2A and 2B.

At block 304, a carbon-containing precursor is flowed into the processing volume 126 from a carbon precursor source. The carbon-containing precursor may be flowed from the gas panel 130 into the processing volume 126 through the showerhead 120. In one embodiment, the carbon-containing precursor is a gaseous mixture of one or more hydrocarbon compounds. The hydrocarbon source may include a gas-phase hydrocarbon compound and/or a gas mixture including vapors of a liquid-phase hydrocarbon compound and a carrier gas.

In one embodiment, the hydrocarbon compound has a general formula $C_xH_y$, where x has a range of between 1 and 10 and y has a range of between 2 and 22. Suitable hydrocarbon compounds may include, but are not limited to alkanes such as propane, methane, ethane, butane and its isomer isobutane, pentane and its isomers isopentane and neopentane, hexane and its isomers 2-methylpentane, 3-methylpentane, 2,3-dimethylbutane, and 2,2-dimethylbutane, and so on; alkenes such as ethylene, propylene, butylene and its isomers, pentene and its isomers, and the like, dienes such as butadiene, isoprene, pentadiene, hexadiene and the like, and halogenated alkenes include monofluoroethylene, difluoroethylenes, trifluoroethylene, tetrafluoroethylene, monochloroethylene, dichloroethylenes, trichloroethylene, tetrachloroethylene, and the like. Additional suitable hydrocarbons may include alkynes such as acetylene, propyne, butyne, vinylacetylene and derivatives thereof. Additionally cyclic hydrocarbons, such as benzene, styrene, toluene, xylene, ethylbenzene, acetophenone, methyl benzoate, phenyl acetate, phenylacetylene ($C_8H_6$), phenol, cresol, furan, alpha-terpinene, cymene, 1,1,3,3,-tetramethylbutylbenzene, t-butylether, t-butylethylene, methyl-methacrylate, and t-butylfurfurylether, compounds having the formula $C_3H_2$ and $C_5H_4$, halogenated aromatic compounds including monofluorobenzene, difluorobenzenes, tetrafluorobenzenes, hexafluorobenzene and the like. Halogenated hydrocarbons such as carbon tetrachloride ($CCl_4$), diiodomethane ($CH_2I_2$), chlorofluorocarbon (CFC), bromotrichloromethane ($BrCCl_3$), 1,1-dichloroethylene, bromobenzene, or derivatives thereof may also be used.

In some exemplary embodiments, acetylene ($C_2H_2$) or propyne ($C_3H_6$) is used as the carbon-containing precursor. $C_2H_2$ may be advantageous due to formation of more stable intermediate species which allows more surface mobility.

In some embodiments, the hydrocarbon compounds may be partially or completely doped derivatives of hydrocarbon compounds, including fluorine-containing, oxygen-containing, hydroxyl group-containing, and boron-containing derivatives of hydrocarbon compounds.

A diluent gas and a plasma-initiating gas may be added to the gas mixture. The plasma-initiating gas may be introduced into the processing volume 126 before and/or at same time as the hydrocarbon compound and a plasma is initiated to begin deposition. The plasma-initiating gas may be a high ionization potential gas including, and not limited to, helium gas, hydrogen gas, nitrogen gas, argon gas and combinations thereof. The plasma-initiating gas may also be a chemically inert gas, such as helium gas, nitrogen gas, or argon gas. Suitable ionization potentials for gases are from about 5 eV (electron potential) to 25 eV. The plasma-initiating gas may be introduced into the processing chamber prior to the carbon-containing precursor, which allows a stable plasma to be formed and reduces the chances of arcing.

An inert gas is typically used as a dilution gas or a carrier gas to flow with the carbon-containing precursor. Suitable dilution gases may include argon (Ar), helium (He), hydrogen ($H_2$), nitrogen ($N_2$), ammonia ($NH_3$), noble gas such as krypton, xenon, or any combinations thereof. Ar, He, and $N_2$ may be used to control the density and deposition rate of the amorphous carbon layer. In some cases, the addition of $N_2$ and/or $NH_3$, or $H_2$ and/or $NH_3$, can be used to control the hydrogen ratio (e.g., carbon to hydrogen ratio) of the deposited amorphous carbon layer. In cases where alkynes such as acetylene ($C_2H_2$) or alkenes such as propylene is used as hydrocarbon source, the carrier gas may not be used during the deposition.

At block 306, while flowing the carbon-containing precursor, a metal-containing precursor is flowed into the processing volume 126 from a metal source. The metal-containing precursor may be flowed from the gas panel 130 into the processing volume 126 through the showerhead 120. In some embodiments, the metal-containing precursor may be provided into the processing volume 126 along with the carbon-containing precursor via the apertures 128 of the showerhead 120, or via different gas passages (not shown) provided in the showerhead 120 or other suitable gas distribution components of the process chamber 100. Metal from the metal-containing precursor is reacted with the gaseous mixture of one or more hydrocarbon compounds from the carbon-containing precursor so that the deposited amorphous carbon films are doped with metals, metal alloys, or metal carbides.

In some embodiments, the metal-containing precursor may be a gaseous halide of a desired metal suitable for enhancing the hardness and wear resistance of the deposited amorphous carbon layer. Exemplary metal halides may include metal bromides, metal chlorides, metal fluorides, metal iodides, or any combination thereof. In some embodiments, the desired metal may include one or more of transition metals. Some exemplary transition metals may include, but is not limited to titanium (Ti), zirconium (Zr), hafnium (Hf), vanadium (V), niobium (Nb), tantalum (Ta), chromium (Cr), molybdenum (Mo), tungsten (W), manganese (Mn), rhenium (Re), iron (Fe), cobalt (Co), nickel (Ni), copper (Cu), silver (Ag), gold (Au), palladium (Pd), platinum (Pt), rhodium (Rh), iridium (Ir), ruthenium (Ru), or osmium (Os). Other suitable metals, such as aluminum (Al), may also be used. As an example, the metal-containing precursor may include $TiCl_4$, $ZrCl_4$, $HfCl_4$, $VCl_5$, $NbCl_5$, $TaCl_5$, $TaF_5$, $CrCl_4$, $WCl_5$, $WCl_6$, $WF_6$, or $AlCl_3$.

Alternatively, the metal-containing precursor may be a metal organic compound. Exemplary metal organic compounds may include, but are not limited to metal dialkylamido compounds and/or metal cyclopentadienyl compounds. In some examples, bis(cyclopentadienyl)dimethyl zirconium and/or bis(cyclopentadienyl)dimethyl hafnium may be used to deposit metal doped carbon films. In some embodiments, the metal-containing precursor and the carbon-containing precursor may be the same precursor using the metal organic compound. In such a case, the metal-containing precursor may be a metal organic compound containing both metal and carbon. In embodiments where tungsten (W) is desired in the amorphous carbon layer, the suitable metal organic compound may contain at least tungsten and carbon. One exemplary metal organic compound containing tungsten and carbon is tungsten carbonyl compound. Suitable tungsten carbonyl compounds may include tungsten hexacarbonyl ($W(CO)_6$), tungsten pentacarbonyl compounds ($RW(CO)_5$), and tungsten tetracarbonyl compounds ($R_2W(CO)_4$), wherein R is one or more ligands replacing one or more carbonyl groups. In various examples, each R may be an alkylisonitrile group (R1-N≡C—) wherein each R1 is an alkyl group having from 4 to 8 carbon atoms, such as n-butyl, 1-ethylpropyl, 1,2 dimethylpropyl, isopentyl, 2-methylbutyl, 1-methylbutyl, n-pentyl, 1,3-dimethylbutyl, n-hexyl, 1-methylhexyl, and n-octyl. In cases where the metal organic compound is used, hydrocarbons as discussed in block 304 above may be used as co-reactants to control carbon to metal ratio.

At block 308, a reducing agent is flowed into the processing volume 126 from a reducing agent source. The reducing agent may be flowed from the gas panel 130 into the processing volume 126 through the showerhead 120. The reducing agent may be introduced into the processing volume in an excited state and may be generated in situ or remotely. In either case, the reducing agent is used as a co-reactant and is capable of reducing the metal (or plurality of metals) in the growing film to a lower oxidation state, for example to an elemental metal state, or to a substantially elemental metal state, thereby forming a reduced metal in the deposited amorphous carbon layer. In some embodiments, the reducing agent should be able to remove halide and/or other impurities (e.g., oxygen) species from the growing film.

Suitable reducing agents may include, but are not limited to hydrogen, methane, ammonia, carbon monoxide, or the like. In some embodiments, the reducing agent may be provided in each deposition cycle of the deposition process, flowing together with the carbon-containing precursor and the metal-containing precursor. In some embodiments, the reducing agent may be provided before or after the flowing of the metal-containing precursor. In some embodiments, the reducing agent may be provided into the processing volume 126 at intervals during the deposition process. Alternatively, the reducing agent may be introduced into the processing volume 126 after a metal doped amorphous carbon layer is formed. That is, the deposited metal-doped amorphous carbon layer is exposed to the reducing agent to react with and reduce the metal in the deposited film.

At block 310, a plasma is generated in the interior processing volume 126 to deposit a metal-doped amorphous carbon layer on the material layer. FIG. 3 herein shows one embodiment where the carbon-containing gas, the metal-containing precursor, and the reducing agent are introduced into the interior processing volume 126 before striking a plasma from the gas mixture. In such a case, the carbon-containing gas may be introduced into the processing volume 126 for a longer time such as between about 5 seconds and about 30 seconds, for example about 15 seconds, which may vary depending upon the size of the substrate. The flowing of the carbon-containing gas prior to the introduction of the metal-containing precursor and the reducing agent is believed to provide continuous thermal and pressure stabilization of the processing volume 126. While flowing the carbon-containing gas, the metal-containing precursor and the reducing agent are then flowing into the processing volume 126 about 0.5 seconds to about 5 seconds, for example about 1 seconds to about 2 seconds. The flowing time may vary as long as the flow is just long enough for the metal-containing precursor and the reducing agent to start reaching the processing volume 126 prior to striking the RF plasma.

In some embodiments, the RF plasma may be generated prior to introduction of the metal-containing precursor and the reducing agent into the interior processing volume 126. Alternatively, the RF plasma may be turned off while continuing the flow of the carbon-containing gas into the process volume 126 prior to introduction of the metal-containing precursor and the reducing agent into the interior processing volume 126. In some embodiments, the carbon-containing gas, the metal-containing precursor and the reducing agent may continue flow until a desired thickness of the metal-doped amorphous carbon layer 204 is reached.

The metal-doped amorphous carbon layer may be formed by any suitable deposition process, such as a plasma-enhanced chemical vapor deposition (PECVD) process or a plasma-enhanced atomic layer deposition (PEALD) process. Alternatively, the plasma-enhanced thermal decomposition or reactive process as discussed above may not be used. Instead, the substrate is exposed to the gas mixture of the carbon-containing precursor, the metal-containing precursor, and the reducing agent in the processing volume 126, which is maintained at an elevated temperature suitable for thermal decomposition of the gas mixture. Other deposition processes, such as a metalorganic CVD (MOCVD) process, a atomic layer deposition (ALD) process, evaporation process, or a physical vapor deposition (PVD) process, may also be used to form the deposited metal-doped amorphous carbon.

In any cases, the deposited metal-doped amorphous carbon layer 204 is a synthesis of amorphous carbon films doped with a desired metal, metal alloys, or metal carbides. In one embodiment where the metal-containing precursor contains transition metals (e.g., Ti, Zr, Hf, V, Nb, Ta, Cr, Mo, or W), the deposited amorphous carbon layer is expected to include, or to be doped with transition metal carbides having a stoichiometry corresponding to the following transition metal carbides: monotitanium carbide (TiC), monozirconium carbide (ZrC), monohafnium carbide (HfC), monovanadium carbide (VC), mononiobium carbide (NbC), monotantalum carbide (TaC), trichromium dicarbide ($Cr_3C_2$), dimolybdenum carbide ($Mo_2C$), or monotungsten carbide (WC). Depending upon the metal-containing precursor used, the deposited amorphous carbon layer may have one or more of the above specific transition metal carbides or may be a solid solution carbide of the above carbides, for example, the solid solution carbide may be a solid solution carbide containing W and Ti provided that the carbon stoichiometry corresponds to the stoichiometry of the above transition metal carbides (e.g., ($W_{0.5}$, $Ti_{0.5}$)C). In one embodiment, the deposited amorphous carbon layer is doped with WC.

Certain or all of the processes described in blocks 304-310 may be repeated until a desired thickness is reached. Thickness of the metal-doped amorphous carbon layer 204 is variable depending upon the stage of processing. In one embodiment, the metal-doped amorphous carbon layer 204 may have a thickness from about 100 Å to about 20,000 Å, such as about 300 Å to about 5,000 Å. In some embodiments, the metal-doped amorphous carbon layer may have a thicker thickness of about 2000 Å to about 3000 Å, such that the metal-doped amorphous carbon layer can be consumed during the main etch process with excellent hardmask performance (e.g., good CD control and feature profile) while having thick enough amorphous carbon layer. The resulting metal-doped amorphous carbon hardmask may be used in various applications such as deep oxide contact etches, DRAM capacitor mold etches, and line and/or space etches. In the case of the line and space etch applications such as shallow trench isolation etch hardmask, gate etch hardmask and bit-line etch hardmask, the metal-doped amorphous carbon layer may have about 400 Å to about 2,000 Å. Depending upon the etch selectivity of the dense and isolated regions, the thickness of the layers may be tuned accordingly.

Once the metal-doped amorphous carbon layer 204 with a desired thickness is deposited on the material layer 202, the substrate may be subjected to additional processes, such as the deposition process to form an energy sensitive resist material 208 on the metal-doped amorphous carbon layer 204, and/or patterning process, as discussed above with respect to FIGS. 2B-2E. The metal-doped amorphous carbon layer 204 may be patterned using a standard photoresist patterning techniques. The metal-doped amorphous carbon layer 204 may be removed using a solution comprising hydrogen peroxide and sulfuric acid. One exemplary solution comprising hydrogen peroxide and sulfuric acid is known as Piranha solution or Piranha etch. The metal-doped amorphous carbon layer 204 may also be removed using etch chemistries containing oxygen and halogens (e.g. fluorine or chlorine), for example, $Cl_2/O_2$, $CF_4/O_2$, $Cl_2/O_2/CF_4$. A purge process using a suitable purge gas, such as argon, nitrogen, helium, or combination thereof, may be performed between the processes described above to prevent unwanted condensation of the gas or byproducts on the chamber walls or other component components. The purge process may be performed with no application of RF power.

In general, the following exemplary deposition process parameters may be used to form the metal-doped amorphous carbon layer on a 300 mm substrate. The process parameters may range from a wafer temperature of about 25° C. to about 700° C., for example, between about 200° C. to about 500° C., depending on the application of the hardmask film. The chamber pressure may range from a chamber pressure of about 1 torr to about 20 torr, for example, between about 2 Torr and about 10 Torr. The flow rate of the carbon-containing precursor may be from about 100 sccm to about 5,000 sccm, for example, between about 400 sccm and about 2,000 sccm. If a liquid hydrocarbon source is used, the precursor flow may be between about 50 mg/min to about 1000 mg/min. If a gaseous hydrocarbon source is used, the precursor flow may be between about 200 sccm to about 5000 sccm, for example about 200 sccm to about 600 sccm. The flow rate of a dilution gas may individually range from about 0 sccm to about 20,000 sccm, for example from about 2,000 sccm to about 10,000 sccm. The flow rate of a plasma-initiating gas may individually range from about 0 sccm to about 20,000 sccm, for example from about 200 sccm to about 2,000 sccm. The flow rate of the metal-containing precursor may be from about 1,000 sccm to about 15,000 sccm, for example, between about 5,000 sccm and about 13,000 sccm. The flow rate of the reducing agent may be from about 200 sccm to about 15,000 sccm, for example, between about 1,000 sccm and about 3,000 sccm.

Plasma may be generated by applying RF power at a power density to substrate surface area of from about 0.001 W/cm$^2$ to about 5 W/cm$^2$, such as from about 0.01 W/cm$^2$ to about 1 W/cm$^2$, for example about 0.04 W/cm$^2$ to about 0.07 W/cm$^2$. The power application may be from about 1 Watt to about 2,000 watts, such as from about 10 W to about 100 W, for a 300 mm substrate. RF power can be either single frequency or dual frequency. A dual frequency RF power application is believed to provide independent control of flux and ion energy since the energy of the ions hitting the film surface influences the film density. The applied RF power and use of one or more frequencies may be varied based upon the substrate size and the equipment used. If a single frequency power is used, the frequency power may be between about 10 KHz and about 30 MHz, for example about 13.56 MHz or greater, such as 27 MHz or 60 MHz. If a dual-frequency RF power is used to generate the plasma, a mixed RF power may be used. The mixed RF power may provide a high frequency power in a range from about 10 MHz to about 60 MHz, for example, about 13.56 MHz, 27 MHz or 60 MHz, as well as a low frequency power in a range of from about 10 KHz to about 1 MHz, for example, about 350 KHz. Electrode spacing, i.e., the distance between a substrate and a showerhead, may be from about 200 mils to about 1000 mils, for example, from about 280 mils to about 300 mils spacing.

The process range as discussed herein provides a typical deposition rate for the metal-doped amorphous carbon layer in the range of about 100 Å/min to about 30,000 Å/min and can be implemented on a 300 mm substrate in a deposition chamber available from Applied Materials, Inc. of Santa Clara, Calif. The metal-doped doped amorphous carbon layer may be deposited to a thickness between about 100 Å and about 20,000 Å, such as between about 300 Å to about 5000 Å.

High aspect ratio etches for deep contacts in logic and memory device structures may have aspect ratios from 10:1-75:1 where the hard mask is 10% to 40% of the total stack thickness. The inventive metal-doped amorphous carbon films improves etch selectivity by 40% to 80% which would permit reducing the hardmask thickness by a similarly corresponding amount. The inventive metal-doped amorphous carbon films have been observed to be two to twenty times more etch resistant than currently known undoped amorphous carbon films, allowing for a reduction in hardmask thickness and aspects of the structures. Amorphous carbon films doped with metal elements, particularly carbides of transition metals, can also be used to create an etch hardmask with reduced compressive stress, high hardness in spite of having lower compressive stress, and therefore higher etch selectivity. High etch selectivity enables an even thinner hardmask which improves etch margin and allows for controllable etch of smaller features, thereby obtaining a superior line integrity for devices under sub 45 nm without having conventional issues associated with line wiggling and line bending. It is contemplated that the inventive concept is equally applicable to any carbon-based materials that are used as an etch hardmask for etching the underlying layer, layer stack, or structure.

While the foregoing is directed to embodiments of the present disclosure, other and further embodiments of the disclosure may be devised without departing from the basic scope thereof, and the scope thereof is determined by the claims that follow.

What is claimed is:

1. A method of processing a substrate in a processing chamber, comprising:
    exposing a substrate to a gas mixture comprising a hydrocarbon-containing precursor and a metal-containing precursor;
    thermally reacting the hydrocarbon-containing precursor and the metal-containing precursor in the processing chamber to form a metal-doped amorphous carbon layer over a surface of the substrate;
    forming in the metal-doped amorphous carbon layer a defined pattern of through openings; and
    transferring the defined pattern to an underlying layer beneath the metal-doped amorphous carbon layer using the metal-doped amorphous carbon layer as a mask.

2. The method of claim 1, wherein the hydrocarbon-containing precursor comprises methane ($CH_4$), ethane ($C_2H_6$), ethylene ($C_2H_4$), propylene ($C_3H_6$), propyne ($C_3H_4$), propane ($C_3H_8$), butane ($C_4H_{10}$), butylene ($C_4H_8$) and its isomers, butadiene ($C_4H_6$), acetylene ($C_2H_2$), or combinations thereof.

3. A method of processing a substrate in a processing chamber, comprising:
    exposing a substrate to a gas mixture comprising a carbon-containing precursor, a metal-containing precursor, a hydrogen, methane, ammonia, carbon monoxide, helium, nitrogen, argon, or any combination thereof, wherein the metal-containing precursor is a tungsten carbonyl compound comprising tungsten hexacarbonyl ($W(CO)_6$);
    reacting the carbon-containing precursor and the metal-containing precursor in the processing chamber to form a metal-doped amorphous carbon layer over a surface of the substrate;
    forming in the metal-doped amorphous carbon layer a defined pattern of through openings; and
    transferring the defined pattern to an underlying layer beneath the metal-doped amorphous carbon layer using the metal-doped amorphous carbon layer as a mask.

4. A method of processing a substrate in a processing chamber, comprising:
    flowing a carbon-containing precursor into a processing chamber to expose the substrate to the carbon-containing precursor;

while flowing the carbon-containing precursor, exposing the substrate to a gas mixture comprising a metal-containing precursor and a reducing agent;

exposing the substrate to a plasma formed from the carbon-containing precursor, the metal-containing precursor, and the reducing agent to form a metal-doped amorphous carbon layer over a surface of the substrate;

forming a defined pattern of through openings in the metal-doped amorphous carbon layer; and transferring the defined pattern to an underlying layer beneath the metal-doped amorphous carbon layer using the metal-doped amorphous carbon layer as a mask.

5. The method of claim 4, wherein the metal-containing precursor is a gaseous halide of a metal.

6. The method of claim 5, wherein the metal comprises titanium (Ti), zirconium (Zr), hafnium (Hf), vanadium (V), niobium (Nb), tantalum (Ta), chromium (Cr), molybdenum (Mo), tungsten (W), manganese (Mn), rhenium (Re), iron (Fe), cobalt (Co), nickel (Ni), copper (Cu), silver (Ag), gold (Au), palladium (Pd), platinum (Pt), rhodium (Rh), iridium (Ir), ruthenium (Ru), osmium (Os), or aluminum (Al).

7. The method of claim 4, wherein the carbon-containing precursor comprises at least one hydrocarbon compound having a general formula $C_xH_y$, where x has a range of between 1 and 10 and y has a range of between 2 and 22.

8. The method of claim 4, wherein the reducing agent comprises hydrogen, methane, ammonia, or carbon monoxide.

* * * * *

UNITED STATES PATENT AND TRADEMARK OFFICE
CERTIFICATE OF CORRECTION

PATENT NO. : 9,624,577 B2
APPLICATION NO. : 14/697385
DATED : April 18, 2017
INVENTOR(S) : Pramit Manna et al.

It is certified that error appears in the above-identified patent and that said Letters Patent is hereby corrected as shown below:

In the Claims

In Column 12, Line 43, in Claim 2, delete "acetelyne" and insert -- acetylene --, therefor.

Signed and Sealed this
Twenty-fourth Day of October, 2017

Joseph Matal
*Performing the Functions and Duties of the*
*Under Secretary of Commerce for Intellectual Property and*
*Director of the United States Patent and Trademark Office*